United States Patent [19]

Nakajima et al.

[11] Patent Number: 4,667,113
[45] Date of Patent: May 19, 1987

[54] TOOL FAILURE DETECTION APPARATUS

[75] Inventors: Kiyoharu Nakajima, Yokohama; Taisuke Ito, Fujisawa; Yusui Nakamura, Ebina, all of Japan

[73] Assignee: Hitachi Seiko Ltd., Tokyo, Japan

[21] Appl. No.: 764,071

[22] Filed: Aug. 9, 1985

[51] Int. Cl.[4] .................................. G01N 21/86
[52] U.S. Cl. .................................. 250/561; 408/16
[58] Field of Search .............. 356/372, 375, 388, 394; 250/561; 408/6, 16

[56] References Cited

U.S. PATENT DOCUMENTS 3,367,294 2/1968 Ellison et al. .................. 250/561
3,912,925 10/1975 Gaskell .......................... 250/227
4,502,823 3/1985 Wronski et al. ................ 356/375

Primary Examiner—David C. Nelms
Assistant Examiner—William L. Oen
Attorney, Agent, or Firm—Antonelli, Terry & Wands

[57] ABSTRACT

In a tool failure detection apparatus for a working machine such as a drilling machine for circuit boards, light is irradiated onto a workable area of a workpiece, and reflection light from the workable area is picked up by an imaging unit to produce a video signal. A video signal indicative of at least either one of a tool image and a worked void image which is picked up within a predetermined region of a picture is sampled to calculate an image area. A comparator compares a calculated image area with a preset reference value indicative of normality of the tool to judge whether the tool is normal or broken.

5 Claims, 15 Drawing Figures

TOOL FAILURE DETECTION APPARATUS

BACKGROUND OF THE INVENTION

1. Field of the Invention

This invention relates to an apparatus for detecting a failure of a working tool of a machine tool and more particularly to a working tool failure detection apparatus capable of accurately detecting a failure of even a small size working tool. Although the following detailed description of the invention will be given by way of a drilling machine for printed circuit boards, it should be understood that applicability of the present invention is in no way limited thereto but is valid for other types of machining apparatus.

2. Description of the Related Arts

In a machine tool such as a drilling machine for circuit boards, a board to be worked is placed on a horizontally movable table, and a drill is actuated to bore a desired hole in the board while the table is moved under the direction of a controller programmed with predetermined working sequence and working positions. The workable circuit board consists of a base layer made of bakelite or glass epoxy resin and a copper foil conductor fixedly formed on the base layer. The recent demand for high density packaging of electronic circuits has required an increasing reduction in the size of holes to be bored in the board. Accordingly, the working tool or drill trends toward an increasing reduction in its diameter and as a result, a chance of failure of the drill is on the increase. In spite of the above circumstances, the smaller the drill diameter, the more it becomes difficult to rapidly detect a failure of the drill.

A conventional apparatus for detection of a failure especially breakage of a drill is disclosed in, for example, Japanese Utility Model Unexamined Publication No. 56-33151. According to this proposal, an amount of chips produced by drilling is optically detected so as to determine an occurrence of a break of the drill when the chip amount decreases. With this apparatus, however, the break detection is possible only when chips are produced in a great amount but is impossible in the case of a small chip production amount or no production of chips. Also disclosed in U.S. Pat. No. 3,912,925 is a drill breakage detection apparatus wherein light is irradiated on a drill so that transmitted light can be detected by a photodetector when the drill is broken. This apparatus is highly effective when changes in the quantity of light is dependent on the presence or absence of a drill portion under light irradiation are appreciably great but faces difficulties in discriminating breakage of the tool when the drill portion is small because quantities of light intercepted thereby are small, resulting in small changes in the quantity of light. Moreover, the drill and the photodetector are coaxially aligned with a light source in a narrow, elongated space to increase the scale of the apparatus, leading to incompatibility with the demand for the size reduction of the tool itself.

SUMMARY OF THE INVENTION

The present invention contemplates elimination of the conventional problems and has for its object to provide a tool failure detection apparatus capable of accurately and stably detecting a failure of tools which range from a small size to a large size.

To accomplish the above object, in a tool failure detection apparatus according to the invention, light is irradiated on a portion to be worked of a workpiece, an image of the portion is detected and converted into an electric signal by an imaging unit, and an area of an image indicative of either or both of a worked hole and a tool is calculated by using the electric signal. On the other hand, a particular area of that image obtained when the tool is normal is present as a reference value, and the reference value is compared with an area of that image being currently picked up during a working operation of judge whether the tool is normal or broken.

More specifically, if the tool is in normal condition, a void of the worked hole has a predetermined area and the image of the tool also has a predetermined area. But if the tool is in failure, for example, partly broken, the void of the worked hole has an area which is smaller than that for the normal condition or no void occurs because of the absence of the worked hole. Therefore, when imaging the portion to be worked, a failure can be detected by utilizing the fact that an area of an image indicative of the portion imaged when the tool is broken becomes smaller than that image when the tool is normal. Where the size of the tool is small, an optical system of the imaging unit is so adjusted as to increase the magnification ratio of image, thereby meeting detection of a failure of the small size tool.

Normally, in mechanical working, chips are scattered around the portion to be worked but the amount of chips produced by the normal tool is constant and the chip amount decreases when the tool is broken. Accordingly, even when the imaging unit picks up the chips, a resulting image will not cause an error and may be availed, together with the void image and the tool image, for the area comparison.

DESCRIPTION OF THE PREFERRED EMBODIMENTS

Figure 1:
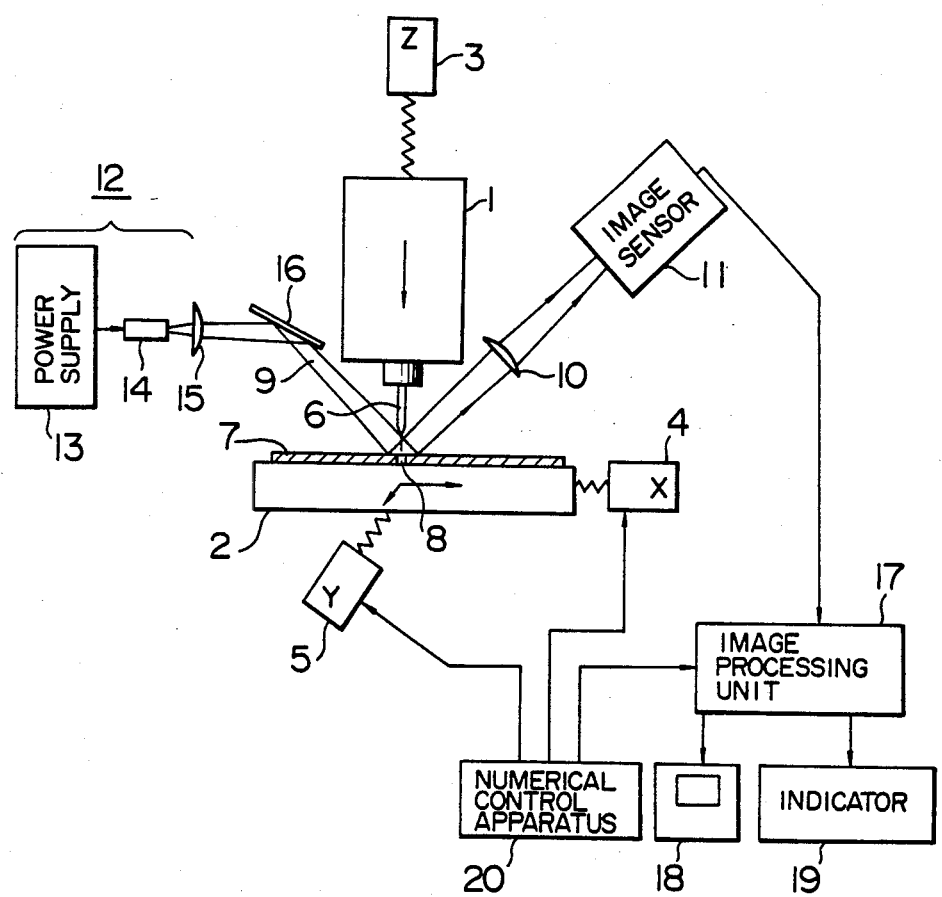
FIG. 1 is a schematic view showing a tool failure detection apparatus according to an embodiment of the invention.

The invention will now be described by way of example with reference to the accompanying drawings. FIG. 1 schematically shows an embodiment of the invention as applied to a drilling machine for printed circuit boards. There are seen in FIG. 1 a spindle 1, and a movable table 2 disposed to oppose the spindle 1. Mounted to one end of the spindle 1 is a drill 6 for boring a printed circuit board 7. The drill 6 is driven to rotate by means of a motor not shown. The table 2 carrying thereon the printed circuit board 7 subject to drilling is free to slide horizontally is X-axis and Y-axis directions by means of separate motors 4 and 5, respectively. The spindle 1 is movable vertically in Z-axis direction by means of a motor 3. These motors 3, 4 and 5 are driven under the control of a numerical control apparatus 20 so that predetermined working operations are carried out automatically.

Figure 2:
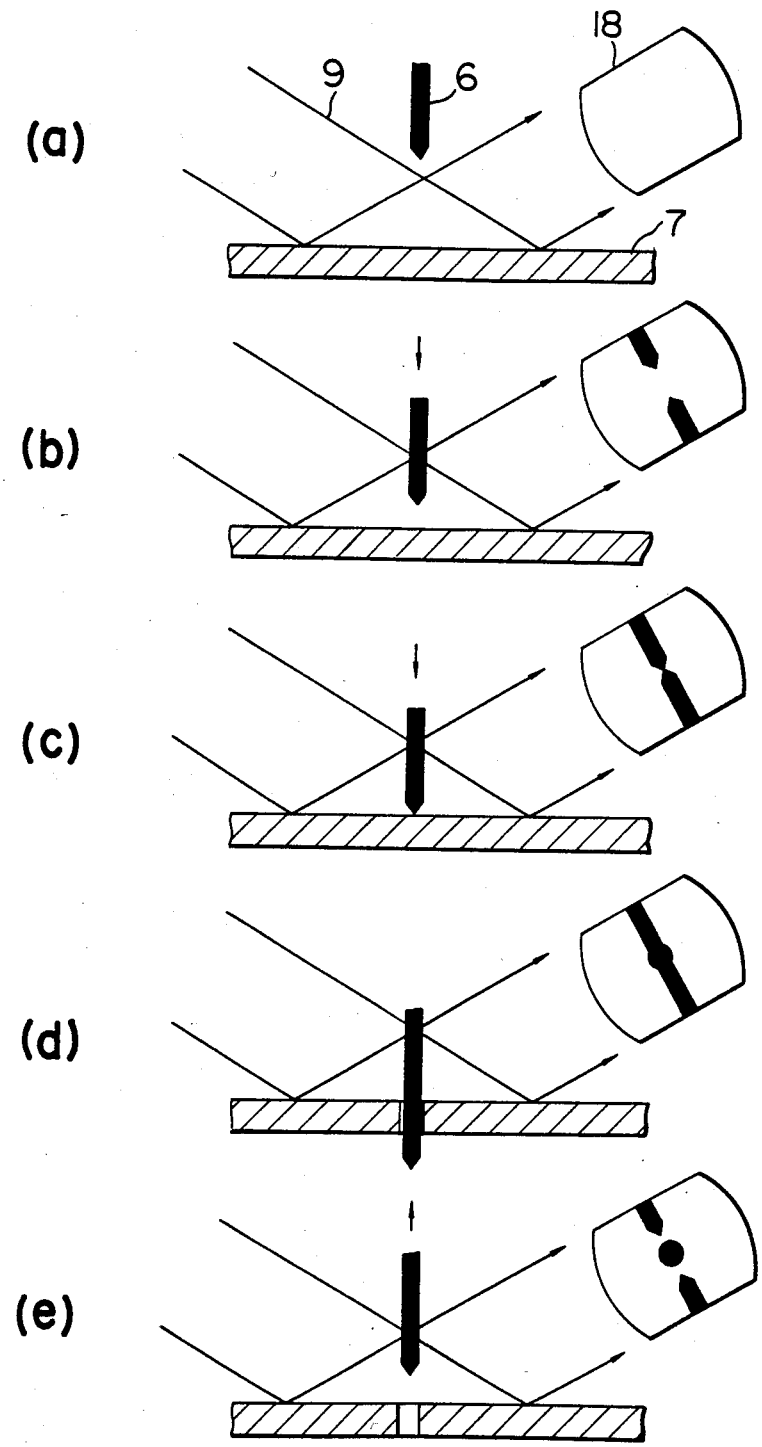
FIG. 2 shows positions of a tool and corresponding images picked up by the imaging unit when the tool is normal.
Figure 3:
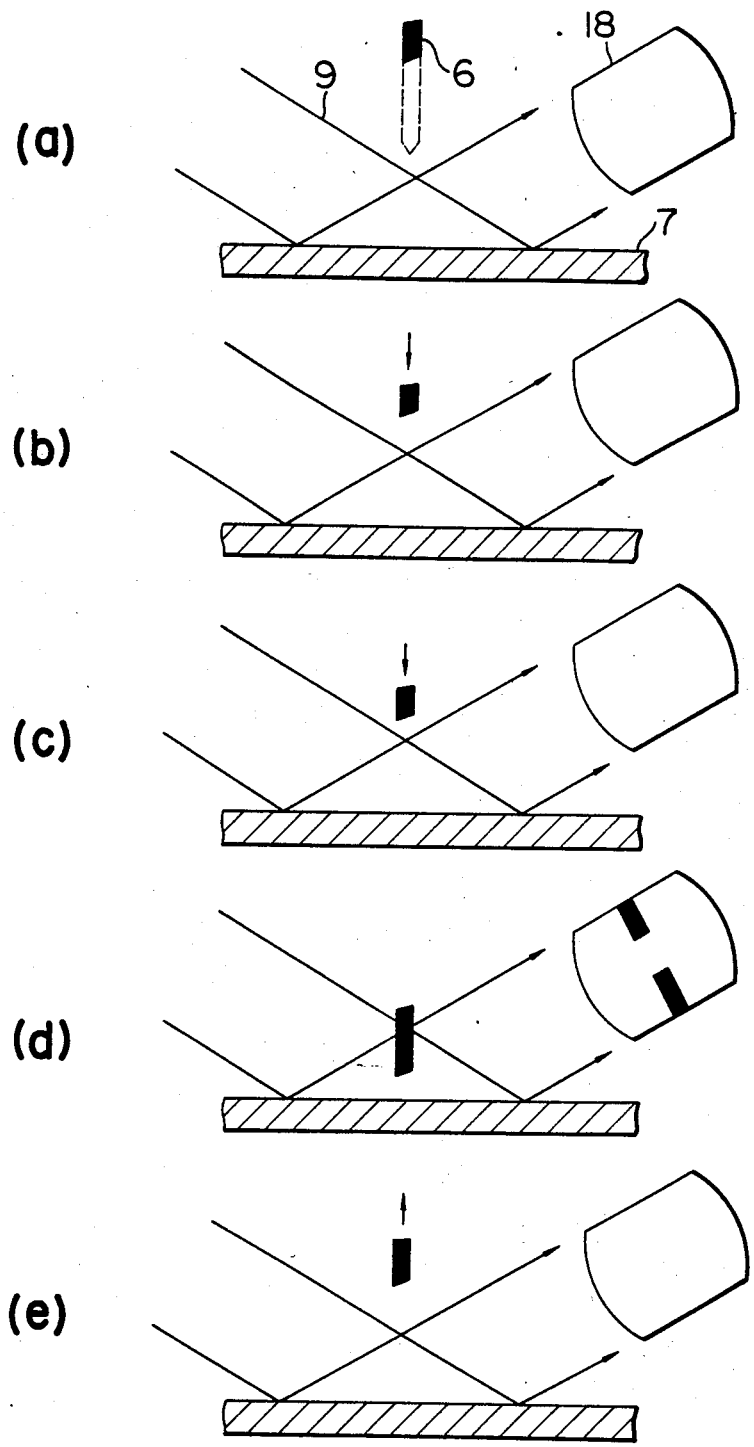
FIG. 3 is a similar diagram when the tool is broken.

A hole 8 is formed in the board 7 by the drill 6. A flux of light 9 from a light source 12 is irradiated on the hole 8 and its neighborhood, reflected by the board 7 and then directed to an image sensor 11 through an objective 10. The image sensor 11 is adapted to convert an image of the hole 8 into an electric signal and it includes a plurality of photodetector elements (such as photoelectric conversion elements) arranged collectively or it includes an image pickup tube. Since the flux of light 9 irradiated on the printed circuit board 7 is uniformly reflected by the surface of the board 7 but irregularly reflected by a void of the worked hole 8, intensity of a light beam reflected from the hole and directed to the image sensor 11 is decreased. The light source 12 includes a power supply 13, a light emitter 14 and a condenser 15. The light emitter 14 emits light of constant intensity under the control of the power supply 13. A reflector 16 is disposed on an incident optical path. If the incident optical path and a reflection optical path are formed of an optical path material such as an optical fiber, flexibility of selection of the optical paths is facilitated, contributing to compactness of the detection apparatus. An image of the hole 8 obtained from an output signal of the image sensor 11 is processed by means of an image processing unit 17 which has one output connected to a television 18 and the other output connected to an indicator 19 such as a buzzer, a colored lamp or a light emitting element. The numerical control apparatus 20 drives the X-axis motor 4 and the Y-axis motor 5 so as to move or position the workpiece 7 on the X-Y coordinates and also drives to Z-axis motor 3 so as to make up and down movement of the tool 6 in the Z-axis direction. The numerical control apparatus 20 also supplies to the image processing unit 17 a signal indicating that the spindle 1 is driven.

Where the tool or drill is normal, images as shown in FIG. 2 are obtained by imaging the board 7 to be worked for boring by means of the image sensor 11. At section (a) in FIG. 2, the drill is lifted up to the highest point, and at sections (b) and (c), the drill is moved in a direction of arrow. Images obtained in accordance with these states of the drill are shown on the right side of the respective illustrations. At section (d) in FIG. 2, the drill reaches the lowest point, completing one drilling operation. At this time, the area of an image occupied by the drill and hole becomes maximum as compared to the other areas of images. An area approximating this maximum area is preset as a reference value indicative of the normal tool. Subsequently, as shown at (e) in FIG. 3, the drill is pulled up in an direction of arrow to provide an image occupied by a void of the worked hole and part of the drill. To describe breakage of the drill, reference is made to FIG. 3. It is now assumed that the drill is broken to lose a dotted line portion as shown at (a) in FIG. 3. At sections (b) and (c) in FIG. 3, the drill is moved in the direction of arrow but no image of the drill is taken. Even when the drill then reaches the lowest point as shown at (d) in FIG. 3, no hole is bored and part of the drill only is taken as an image. By comparing an area of this image with the maximum image area indicative of the normal tool as obtained from the state shown at (d) in FIG. 2, an occurrence of breakage of the tool can definitely be recognized.

Figure 4:
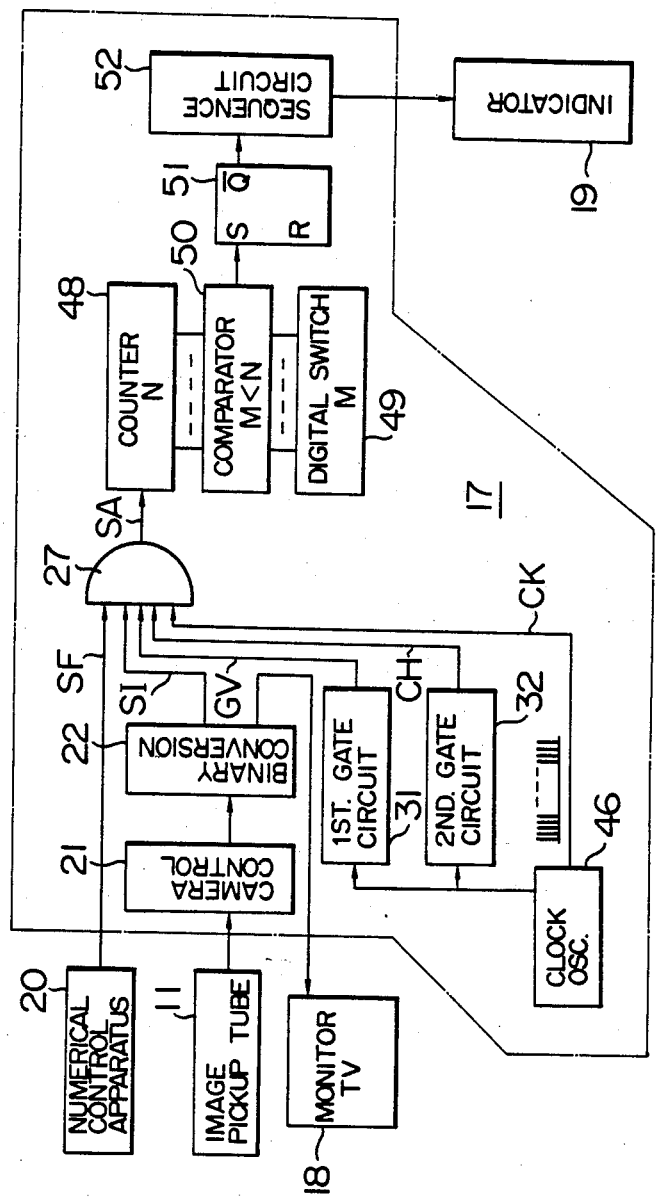
FIG. 4 shows details of an image processing unit shown in FIG. 1.
Figure 5:
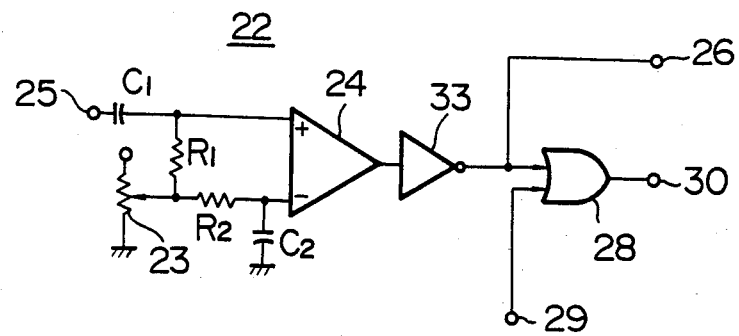
FIG. 5 shows details of a binary signal conversion circuit.
Figure 7:
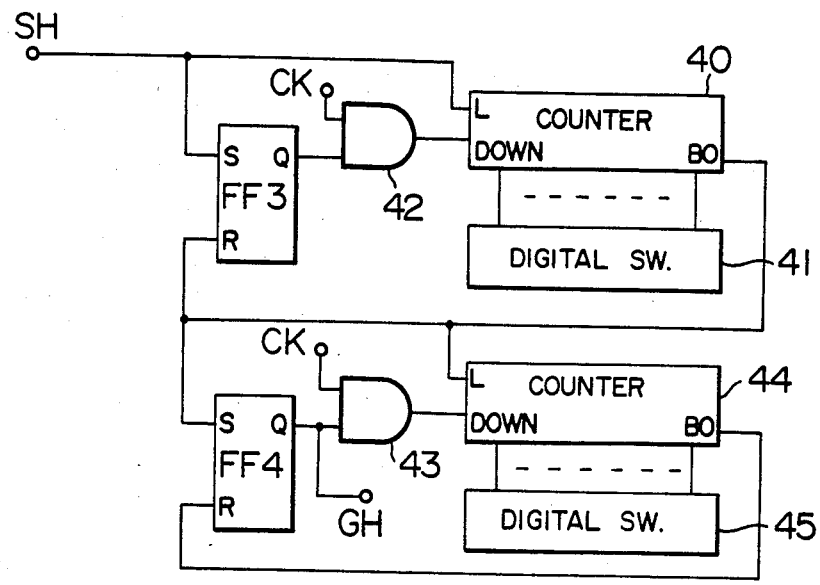
FIG. 7 is a similar diagram of another gate circuit.
Figure 8:
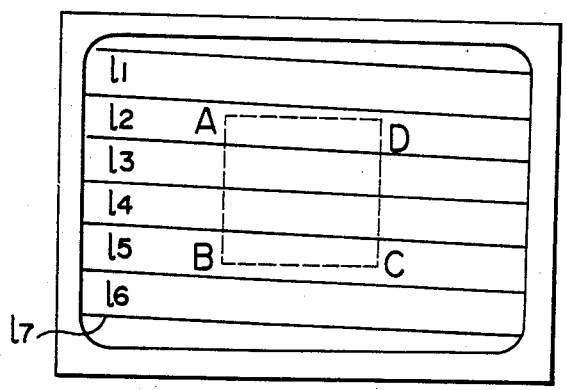
FIG. 8 shows a raster in a television screen.

Details of the image processing unit 17 are exemplified in a block diagram of FIG. 4 in which identical components to those in FIG. 1 are designated by identical reference numerals. As the working for the board 7 proceeds, images are detected and processed by a television camera 11 including an image pickup tube and a camera control circuit 21 so as to be delivered as output video signals. The video signal is referenced to a predetermined threshold level for conversion into a binary signal of "High" and "Low" at a conversion circuit 22 which is constructed as shown in FIG. 5. Referring to FIG. 5, the binary conversion circuit 22 comprise a variable resistor 23 for setting the predetermined threshold level, a comparator 24, an inversion amplifier 33, an input terminal 25 connected to the camera control circuit 21, resistors R1 and R2, capacitors C1 and C2, an output terminal 26 connected between the inversion amplifier 33 and an AND gate 27 (FIG. 4), and an OR gate 28 having one input connected to the output terminal 26, the other input connected to an input terminal 29 for reception of a sync signal for the television 18 and an output connected to an output terminal 30 connected to the television 18. Returning to FIG. 4, there are provided gate circuits 31 and 32 for production of video signals from only a region indicative of the worked portion and its neighbourhood within a picture picked up by the television camera. Particularly, the first gate circuit 31 determines a vertical gating interval for the video signal and the second gate circuit 32 determines a horizontal gating interval for the video signal. These gate circuits are respectively detailed, in block form, in FIGS. 6 and 7. FIG. 8 shows a raster obtained when the television camera shoots the board. Video signals within a region defined by a dotted line ABCD are sampled by the gate circuits 31 and 32. The television camera may be positioned so as to pick up a worked hole whose image is displayed substantially at the center of this region. For simplicity of illustration, only seven scanning lines are depicted in FIG. 8 but practically the number of scanning lines may be increased.

Figure 6:
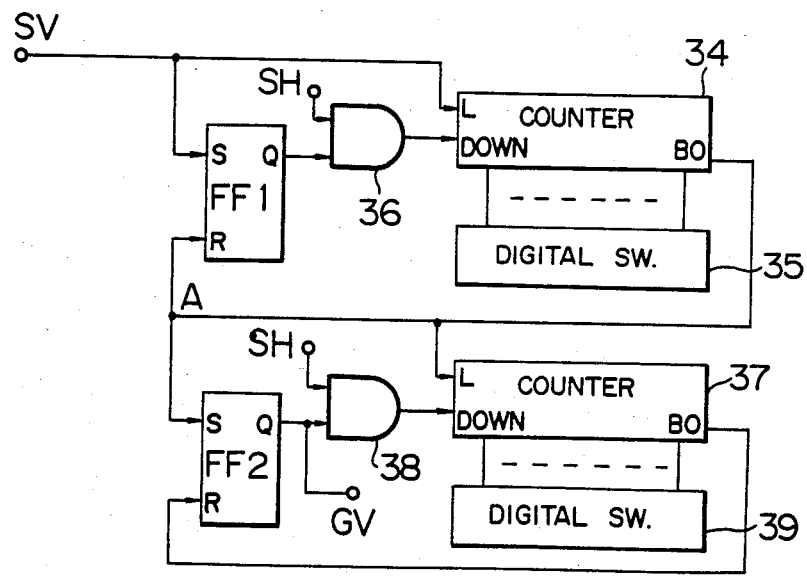
FIG. 6 is a schematic diagram of a gate circuit for setting a detection range of a picture.

The first gate circuit shown in FIG. 6 determines an interval AB depicted in FIG. 8 by counting the number of occurrences of a horizontal sync pulse SH which control timings of the video signal for the scanning lines $l_1$ to $l_7$. Referring to FIG. 6, a vertical sync signal SV is applied to a set input terminal of a flip-flop FF1 and a load terminal of a counter 34. A digital switch 35 is operated by the operator to preset the number of scanning lines vertically ranging from the scanning line $l_1$ to a position A on the raster of FIG. 8. When applied with an input data indicative of the number of the scanning lines, the digital switch 35 outputs a digital signal corresponding to the data. A digital numerical value corresponding to the numerical data preset in the digital switch 35 is initially loaded on the counter 34 each time an occurrence of the vertical sync signal is supplied to the counter 34.

In response to the occurrence of the vertical sync signal SV applied to the set input terminal S of the flip-flop FF1, this flip-flop FF1 produces a "High" output signal. An AND gate 36 has one input connected to receive the output signal of the flip-flop FF1 and the other input connected to receive the horizontal sync signal SH. Accordingly, each time the occurrence of the horizontal sync signal SH is supplied to the AND gate 36, this AND gate 36 delivers a "High" output signal to a down count input of the counter 34, so that the initially loaded numerical value of the counter 34 is decremented one by one scanning line. When the scanning line proceeds by the number preset in the digital switch 35, the numerical value of the counter 34 is zeroed and a signal is produced from a terminal Bo. This signal simultaneously resets the flip-flop FF1, sets a flip-flop FF2 and sets a counter 37. Upon setting of the counter 37, a numerical data preset in a digital switch 39 is loaded on the counter 37. Since the flip-flop FF2 remains set to deliver a "High" output signal to an AND gate 38, occurrences of the horizontal sync signal SH are supplied to a count down input of the counter 37. The digital switch 39 connected in parallel with the counter 37 is preset with the numerical value corresponding to an interval AB depicted in FIG. 8. As the scanning line proceeds by the number which coincides with this numerical value, the flip-flop FF2 is reset. An output signal GV which has risen simultaneously with the setting of the flip-flop FF2 now falls in response to the resetting of the flip-flop FF2. Thus, this signal GV serves as a gating signal which determines the interval AB. FIG. 7 shows the second gate circuit adapted to determine a horizontal range of the picture and having a construction which is basically the same as that of the first gate circuit. The horizontal sync signal SH is supplied to a set terminal of a flip-flop FF3 and a set terminal (L) of a counter 40. A digital switch 41 and an AND gate 42 are connected to the counter 40. The AND gate 42 has one input connected to the output of the flip-flop FF3 and the other input connected to receive a clock pulse CK. The digital switch 41 is preset with a numerical value indicative of a distance between the lefthand end of the scanning line and the point A. Each time an occurrence of the horizontal sync signal SH is applied to the counter 40, a digital value (indicative of the number of occurrences of the clock pulse) corresponding to the numerical value preset in the digital switch 41 is loaded on the counter 40. The loaded value of the counter 40 is decremented, each time an occurrence of the clock pulse CK is supplied to the AND gate 42, until it is zeroed and a "High" output signal is delivered out of a terminal BO. A similar arrangement including a flip-flop FF4, an AND gate 43, a counter 44 and a digital switch 45 responds to this "High" output signal to determine an interval AD shown in FIG. 8. Thus, a gating signal GH which is high over the interval AD is delivered out of the flip-flop FF4.

Turning to FIG. 4, the AND gate 27 receives a drive signal SF for the Z-axis motor 3 fed from the numerical control apparatus 20, the clock pulse CK outputted from a clock oscillator 46, and a video signal SI of binary form sent from the binary signal conversion circuit 22.

Figure 9A:
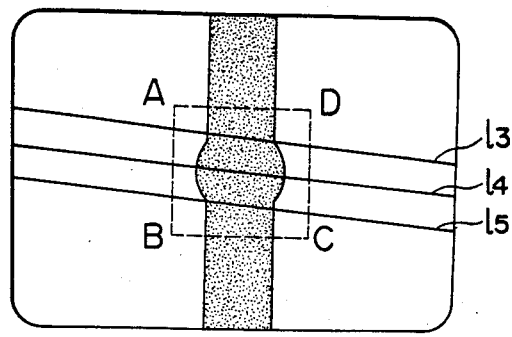
FIG. 9A shows detected images of a worked hole and a tool.
Figure 9B:
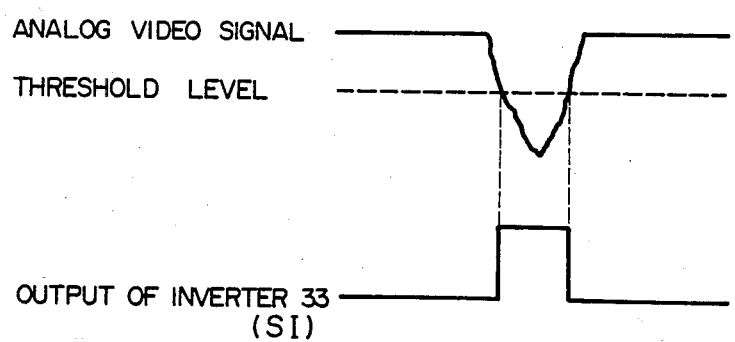
FIG. 9B shows a video signal waveform obtained by scanning the worked hole and tool of FIG. 9A.

The operation of the binary signal conversion circuit 22 will now be described in greater detail. An analog video signal produced from the television camera 11 is applied to the input terminal 25 shown in FIG. 5. In order to calculate the area of the image according to the invention, inetermediate gradation of the image is unnecessary and it will do that two values of white and black respectively indicative of the background and the image can be discriminated. Therefore, the variable resistor 23 is set to provide a threshold level which is discriminant for the background and the image, and the analog video signal is compared with the threshold level at the comparator 24, thereby producing a binary signal of "High" or "Low". Since the analog signal assumes a minus level corresponding to a dark portion, the binary signal is inverted by the inverter 33. FIG. 9A illustrates an image of the worked hole and the drill corresponding to the state shown at section (d) in FIG. 2, and FIG. 9B illustrates a video signal waveform and an inverted binary signal produced when the image is scanned with the horizontal scanning line 14.

Figure 10:
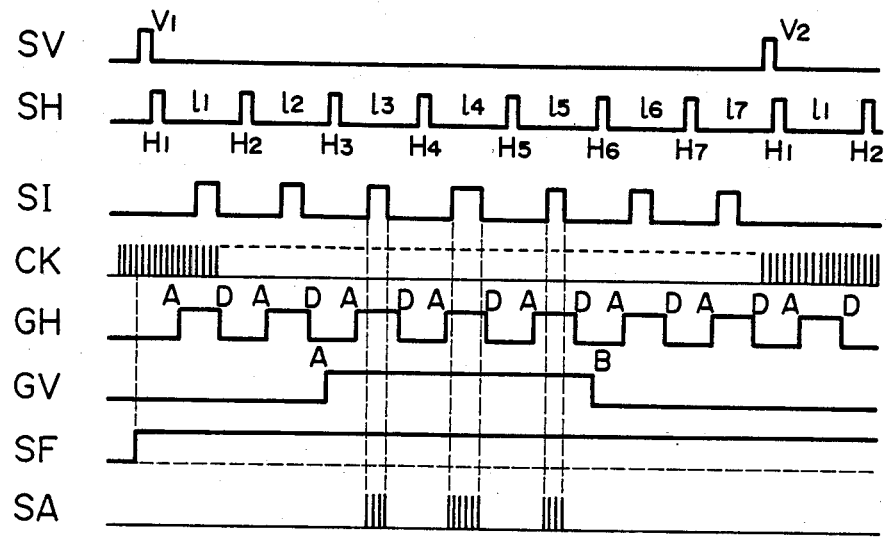
FIG. 10 is a time chart showing input signals and an output signal of an AND gate.

The operation of the AND gate 27 will now be described with reference to waveforms as shown in FIG. 10. The waveforms are illustrative of the vertical sync signal SV (inclusive of occurrences V1 and V2), horizontal sync signal SH (inclusive of occurrences H1 to H7), binary video signal SI corresponding to horizontal scanning lines 11 to 17, clock pulse CK, output signal GH from the second gate circuit 32 of FIG. 7 which is high over the interval AD in the picture, output signal GV from the first gate circuit 31 of FIG. 6 which is high over the interval AB in the picture and the motor drive signal SF for driving the spindle 1. These signals SI, CK, GH, GV and SF are inputted to the AND gate 27 and ANDed to produce a signal SA. In this manner, the size of an image confined within the region ABCD is proportioned to the number of occurrences of the clock pulse and delivered out.

The operation of a circuit arrangement succeeding the AND gate 27 as shown in FIG. 4 will now be described. A counter 48 counts and accumlates the occurrences of the clock pulse delivered out of the AND gate 27. A count value within one occurrence of the signal SA corresponding to the normal tool is experimentally determined in advance, and a numerical value allowed to be used for decision of normality of the tool and amounting to, for example, about 60% of the maximum count value within one occurrence of the signal SA for the normal tool is preset as a reference value M in a digital switch 49. Upon start of the working operation, the counter 48 initiates to count and accumulate occurrences of the clock pulse SA sent from the AND gate 27. When a count value N of the counter 48 exceeds the reference value M, a comparator 50 comparing these values produces a comparison signal which sets a flip-flop 51. The flip-flop 51 then produces at its $\bar{Q}$ output terminal a "Low" signal. On the other hand, "High" signal is outputted from flip-flop 51 when the count value N does not exceed the reference value M. A sequence circuit 52 responds to the "Low" or "High" signal from the flip-flop 51. In response to the "Low" signal, the sequence circuit 52 deactivates the motors 3, 4 and 5 for driving the X, Y and Z axes and to cause the indicator 19 to indicate breakage of the tool.

The reference velue M has been so set as to be 60% of the maximum value for the image of the normal tool, but it is not limited to this value and may be any values which are experimentally optimized in consideration of irregularity of working and noise of the image. If the frequency of the clock pulse is increased, the difference between normality and breakage of the tool can be detected more accurately. In the foregoing embodiment of the invention, the area of the image within the predetermined region ABCD is determined by counting and accumulating the video signal. In an alternative, however, a video signal associated with only one predetermined horizontal scanning line may be counted for comparison with a video signal for the normal tool also associated with the one predetermined horizontal scanning line. In this manner, breakage of the tool can also be detected. Thus, the number of the scanning lines to be used for detection or the extension of the image area to be counted may be determined desirably in consideration of S/N ratio or detection accuracy.

Figure 11:
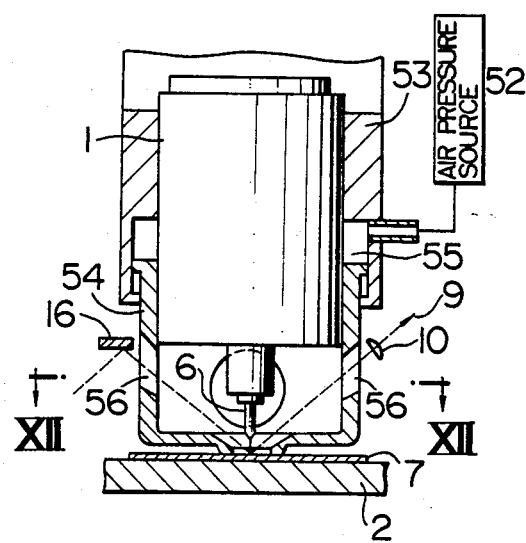
FIG. 11 is a longitudinal sectional view showing another embodiment of the invention.
Figure 12:
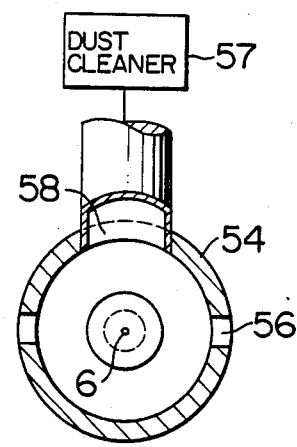
FIG. 12 is a sectional view taken on line XII—XII in the apparatus of FIG. 11.

Referring to FIG. 11, there is illustrated another embodiment of the invention as applied to a circuit board drilling machine combined with a pressure foot 54. The role of the pressure foot is described in Japanese Utility Model Unexamined Publication No. 56-33151 mentioned previously and U.S. Pat. No. 4,420,685 and will be described briefly. In order to prevent the circuit board 7 from floating above the table 2, during progression of the working oepration, pressurized air from an air pressure source 52 is supplied to a cylinder 55 defined by a housing 53, an outer periphery of a spindle 1 and the pressure foot 54, and a lower end surface of the pressure foot 54 slidable in the cylinder 55 is pressed against the circuit board 7. Formed in the side wall of the pressure foot 54 are holes 56 through which the flux of hight 9 passes. In this embodiment, these holes 56 for passage of light are not covered with transparent plates serving as windows. Consequently, deposition of chips and mists, generated from the heated board during drilling, to the inner surface of any windows which would otherwise occur can be prevented, bringing about an advantage that capability of breakage detection can be prolonged. Each hole 56 is an elongated (approximately, elliptical or oblong) hole having a major axis in the vertical direction. The side wall of the pressure foot 54 is also formed with a suction hole 58 which is distant from the elongated holes 56. The suction hole 58 is in communication with a dust cleaner 57. During the working operation, chips are constantly sucked up by the dust cleaner to keep the interior of the pressure foot cleaned. Because of the formation of the suction hole 58 and elongated holes 56 in the side wall of the pressure foot 54 and because of the disposition of a reflector 16 and an objective 10 exteriorly of the elongated holes 56, the chips can be completely exhausted without causing adherence of the chips to the drill being prone to breakage of the drill and deposition of the chips to the reflector 16 and objective 10 being prone to interception of flux of light. Especially, when the elongated holes 56 are larger than the reflector 16 and the objective 10, it has experimentally proven that the deposition of the chips to the reflector 16 and objective 10 can be prevented highly efficiently.

Figure 13:
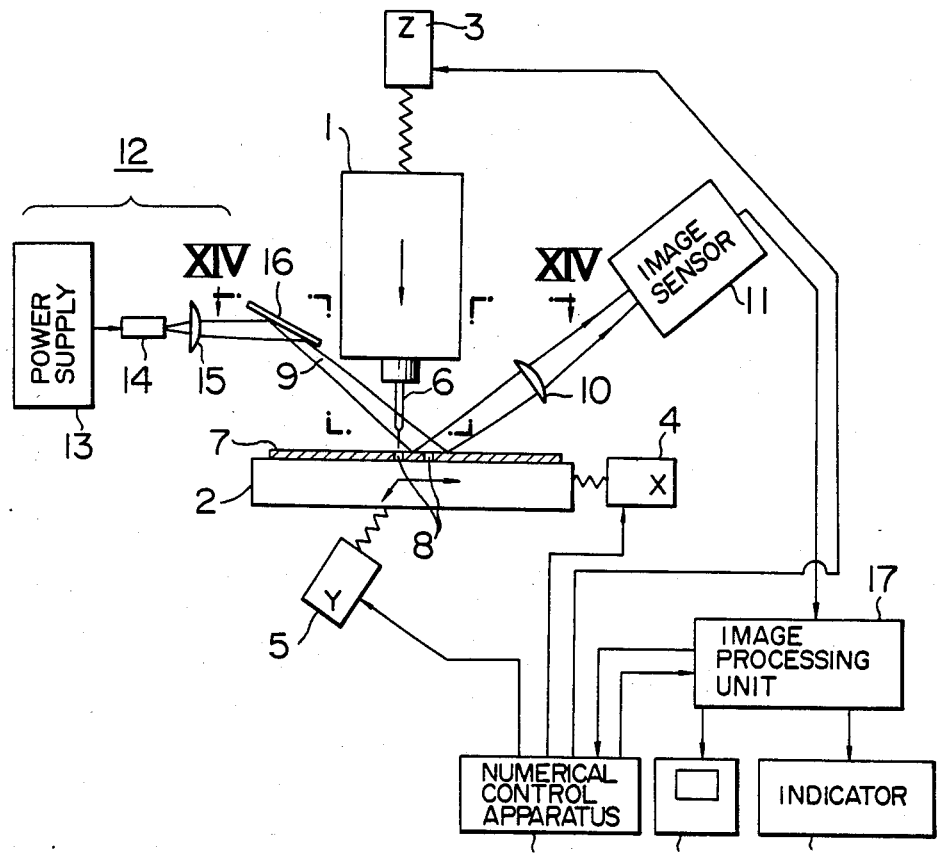
FIG. 13 is a schematic view showing still another embodiment of the invention.
Figure 14:
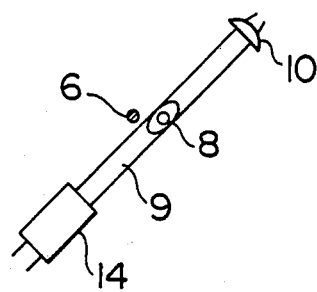
FIG. 14 is a plan view as viewed from line XIV—XIV in FIG. 13.

Still another embodiment of the invention will now be described by making reference to FIGS. 13 and 14. In FIG. 13, identical components to those in FIG. 1 are designated by identical reference numerals. Basically, this embodiment has the same construction as that of the FIG. 1 embodiment, excepting the following points.

More particularly, while in the FIG. 1 embodiment the drill and the void of worked hole are simultaneoulsy observed by the television camera, an optical system of the FIG. 13 embodiment is arranged in such a manner that flux of light 9 from a light source 12 impinges only on a void of the worked hole immediately preceding the drill in terms of sequence of drilling. FIG. 14 is a plan view of a board 7 as seen from line XIV—XIV in FIG. 13, indicating a status wherein the flux of light 9 deviates from the drill 6 to impinge only on a void 8 of the worked hole. This arrangement, even in the event that the drill is broken to leave behind its portion on the board 7, can accurately detect breakage of the drill without being affected by an image of the drill portion left below a spindle 1.

It will be noted that the foregoing embodiment incorporate the monitor television 18. A picture displayed on the television 18 may be recorded on a video tape and utilized more efficiently by making analysis of a worked state based on the recorded information. If the video signal is not converted into a binary form but is applied, in the form of an ordinary analog video signal, to the monitor television 18, working states in progress may be monitored by the operator. In this case, the monitoring can be facilitated by drawing on the screen of the television 18 lines parallel to the vertical or horizontal axis or describing a crucial cross lines at the center of the screen to provide a reference for easy observation of the size or position of the worked hole void, and at the same time, by providing on the screen a scale for accurate recognition of the size and position of the void. In addition, if the light source is an intermittent light source (rectangular-wave or pulse light source) which is synchronized with the working operation of the tool and the void of the worked hole is monitored at timings for finish of the working, temperature rise in the printed circuit board due to heat by irradiation of the light beam thereon may be suppressed to support durability of the printed circuit board which is sensitive to thermal deformation.

We claim:

1. A tool failure detection apparatus for a working machine having a working tool movable relative to a workpiece, said detection apparatus comprising:
    means for irradiating light onto a surface of a working area of said work piece;
    means for receiving reflection light reflected from said workpiece and detecting at least either one of a worked void of said working area and said working tool;
    means for calculating an area of a detected image within a predetermined region;
    means for setting a reference value based on a particular area of the detected image obtained when said working tool is not broken; and
    means for comparing said reference value with the area calculated by said calculating means and judging whether or not said working tool is broken.

2. A tool failure detection apparatus according to claim 1 wherein said image detecting means comprises:
    an imaging unit;
    means for scanning a picture picked up by said imaging unit to produce a video signal; and
    means for converting said video signal into a binary signal, and wherein said area calculating means comprises:
    a first gate circuit for setting a vertical range of said picked up picture;
    a second gate circuit for setting a horizontal range of said picked up picture; and means for counting particular video signals in the form of binary signals indicative of said ranges set by said first and second gate circuits, a value counted by said counting means corresponding to said picture area.

3. A tool failure detection apparatus according to claim 2 wherein said reference value setting means is set with a value M based on said particular area of the detected image obtained when said working tool is normal, and said judging means comprises a comparator which receives a value N counted by said counting means and said value M when said working machine is operated, thereby to produce a signal indicative of normality of said working tool when $M<N$ and a signal indicative of breakage of said working tool when $M \geq N$.

4. A tool failure detection apparatus according to claim 1 wherein said working machine comprises casing means for housing said working tool and surrounding the workable area of said workpiece, said casing means having two openings through which incident light from said light irradiating means and reflection light from said workable area pass, respectively.

5. A tool failure detection apparatus according to claim 1 wherein said light irradiating means and said image detecting means are arranged so as not to effect detection of said working tool when they effect detection of an image of said void.

* * * * *